(12) United States Patent
Huang et al.

(10) Patent No.: US 12,315,560 B2
(45) Date of Patent: May 27, 2025

(54) INTEGRATED CIRCUIT DEVICE AND MANUFACTURING METHOD OF THE SAME

(71) Applicant: TAIWAN SEMICONDUCTOR MANUFACTURING COMPANY, LTD., Hsinchu (TW)

(72) Inventors: Huai-Ying Huang, New Taipei (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 648 days.

(21) Appl. No.: 17/554,183

(22) Filed: Dec. 17, 2021

(65) Prior Publication Data

US 2023/0197145 A1  Jun. 22, 2023

(51) Int. Cl.
*G11C 11/413* (2006.01)
*G11C 11/412* (2006.01)
*G11C 19/18* (2006.01)
*H10B 10/00* (2023.01)

(52) U.S. Cl.
CPC .......... *G11C 11/413* (2013.01); *G11C 11/412* (2013.01); *G11C 19/184* (2013.01); *H10B 10/12* (2023.02)

(58) Field of Classification Search
CPC ... G11C 11/413; G11C 11/412; G11C 19/184; H10B 10/12; H01L 27/0207
See application file for complete search history.

(56) References Cited

U.S. PATENT DOCUMENTS

| | | | |
|---|---|---|---|
| 2005/0151276 A1* | 7/2005 | Jang | H10B 10/125 257/427 |
| 2009/0224330 A1* | 9/2009 | Hong | H10B 10/125 438/455 |

* cited by examiner

*Primary Examiner* — Daniel D Chang
(74) *Attorney, Agent, or Firm* — Birch, Stewart, Kolasch & Birch, LLP

(57) ABSTRACT

A device is disclosed, including a latch circuit, a first pass-gate transistor, and a second pass-gate transistor. The latch circuit stores a bit data and is arranged in a first layer. The first pass-gate transistor and the second pass-gate transistor are arranged in a second layer separated from the first layer. The first pass-gate transistor is coupled between a first bit line and a first terminal of the latch circuit, and the second pass-gate transistor is coupled between a second bit line and a second terminal of the latch circuit.

20 Claims, 13 Drawing Sheets

FIG. 4A

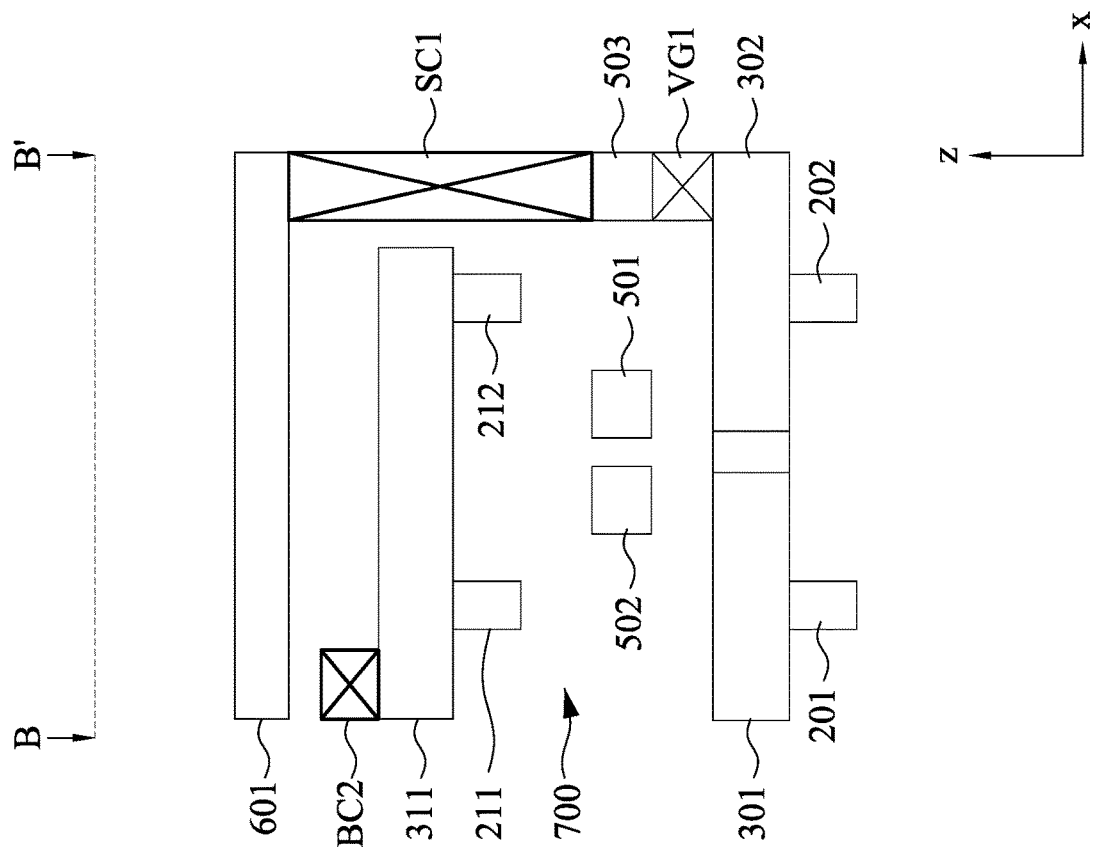
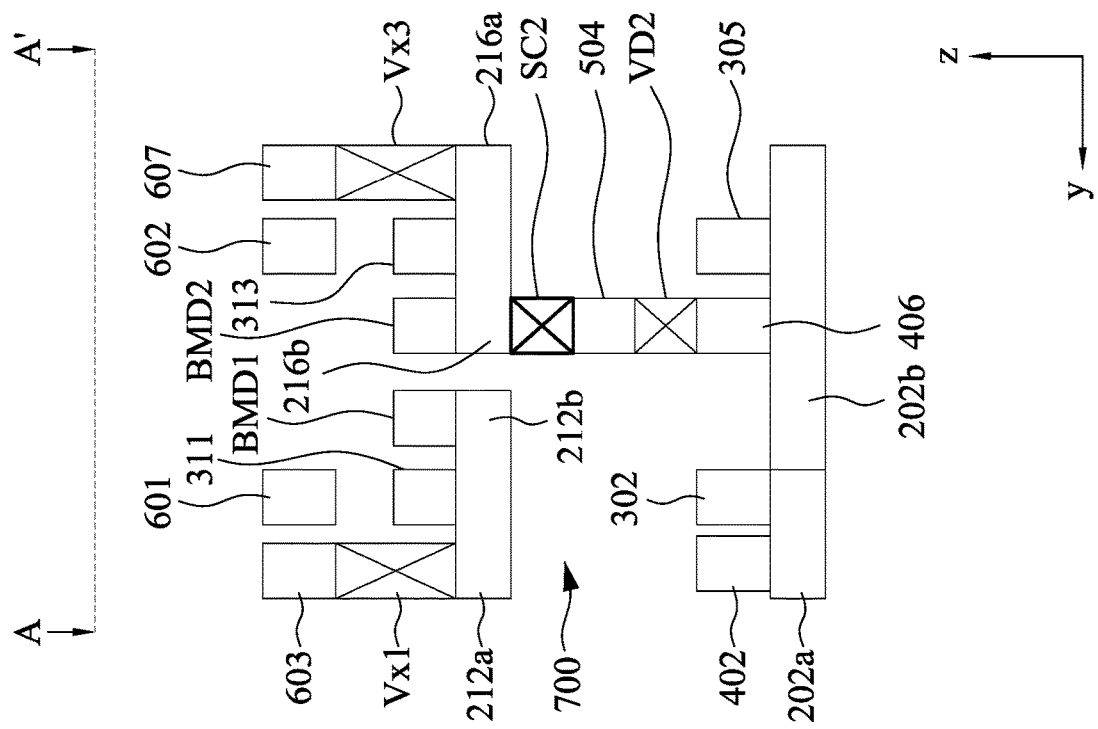
FIG. 5B
FIG. 5A

INTEGRATED CIRCUIT DEVICE AND MANUFACTURING METHOD OF THE SAME

BACKGROUND

Memory is an important component in a computer, and many different memory structures have been developed for different applications. For example, the memory structures include dynamic random access memory (DRAM), static random-access memory (SRAM), read-only memory (ROM), flash memory, etc. A SRAM cell can be utilized to store a digital bit of data between the inverters. As the semiconductor industry continues to improve the integration density of various electronic components by continual reductions in minimum feature size, which allow more components to be integrated into a given area, it is desirable in many applications to reduce the size of SRAM cells, to improve device performance, reduce power requirements, and allow more SRAM cells to be positioned within a given amount of surface area on an integrated circuit die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C are layout diagrams in a plan view of a section of the device corresponding to the memory device in FIGS. 1-2, in accordance with some embodiments.

FIGS. 5A-5B are cross-sectional views of the layout diagram of the device in FIGS. 3A-4C along lines AA' and BB' respectively, in accordance with some embodiments.

DETAILED DESCRIPTION

Figure 1:
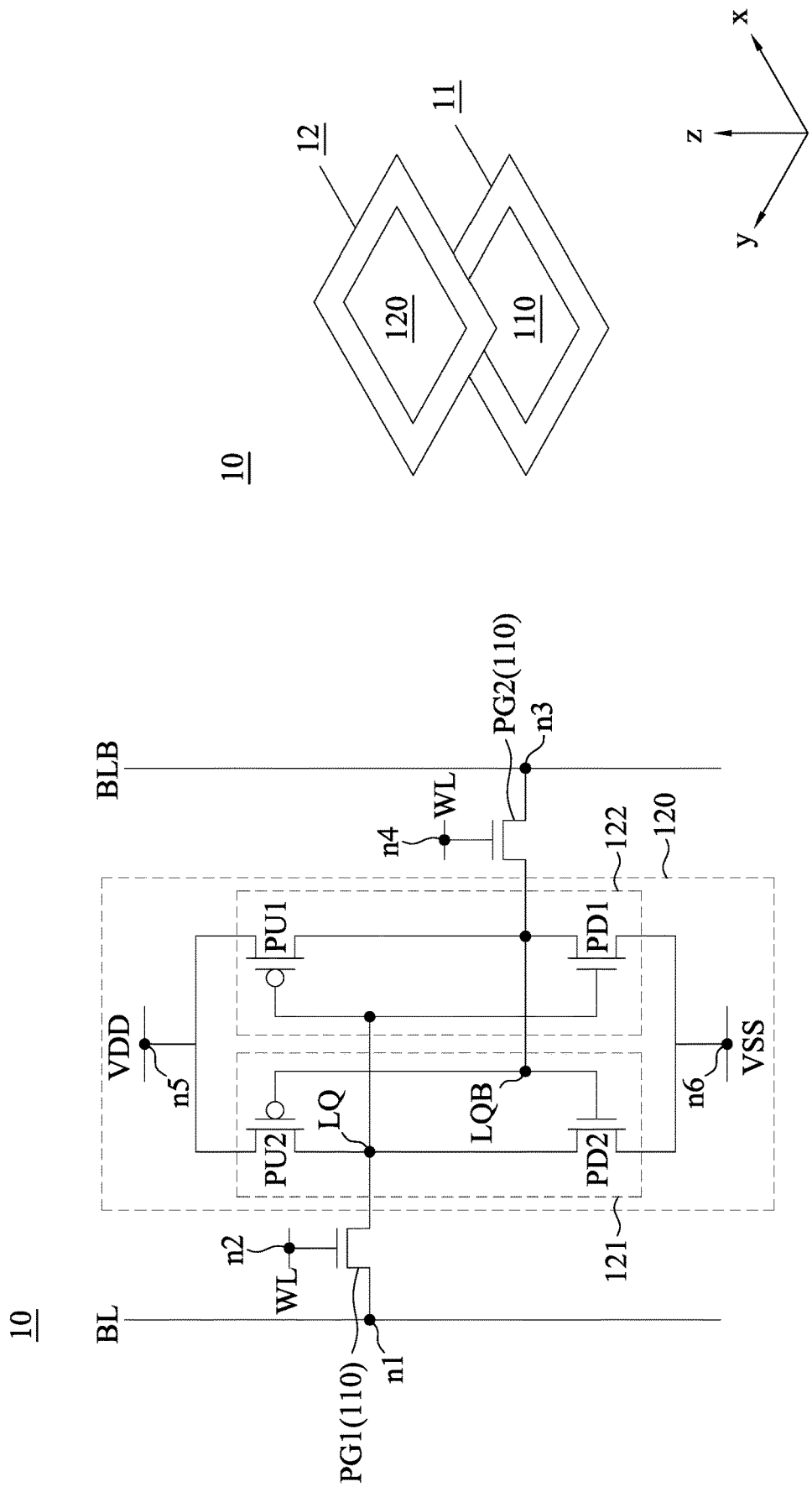
FIG. 1 is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 10, in accordance with some embodiments. For illustration, the memory device 10 includes a pair of pass-gate transistors PG1 and PG2 in a pass circuit 110. In some embodiments, pass-gate transistors PG1 and PG2 are NMOS transistors. The pass-gate transistor PG1 has its drain terminal coupled to a bit line BL at a node n1, its gate terminal coupled to a word line WL at a node n2, and its source terminal coupled to a node LQ which is referred to as a terminal of the latch circuit 120. The pass-gate transistor PG2 has its drain terminal coupled to a bit line BLB at a node n3, its gate terminal coupled to the word line WL at a node n4, and its source terminal coupled to a node LQB which is referred to as another terminal of the latch circuit 120.

As shown in FIG. 1, the memory device 10 also includes a latch circuit 120. For illustration, the pass-gate transistor PG1 is coupled between the bit line BL and the latch circuit 120, and the pass-gate transistor PG2 is coupled between the bit line BLB and the latch circuit 120. The latch circuit 120 is formed by a pair of cross-coupled inverters 121 and 122. The inverter 121 includes a pull-up transistor PU2 and a pull-down transistor PD2. The pull-up transistor PU2 has its source terminal coupled to a high-voltage source VDD at a node n5 and its drain terminal coupled to the node LQ, which serves as an output terminal of the inverter 121. The pull-down transistor PD2 has its source terminal coupled to a low-voltage source VSS at a node n6 and its drain terminal coupled to the node LQ. Gate terminals of transistors PU2 and PD2 are coupled together at the node LQB, which serves as an input terminal of inverter 121 and an output of the inverter 122. The inverter 122 includes a pull-up transistor PU1 and a pull-down transistor PD1. The pull-up transistor PU1 has is source terminal coupled to the node n5, its gate terminal coupled to the node LQ, and its drain terminal coupled to the node LQB. The pull-down transistor PD1 has its source terminal coupled to the node n6, its drain terminal coupled to the node LQB, and its gate terminal coupled to the node LQ. In some embodiments, the pull-up transistors PU1-PU2 are implemented with P-type MOS transistors, and the pull-down transistors PD1-PD2 are implemented with N-type transistors.

In some embodiments, the pass-gate transistor PG1 is configured as a first write transistor, and the pass-gate transistor PG2 is configured as a second write transistor. For illustration, the pass-gate transistors PG1-PG2 are controlled by a word line signal in the word line WL. The output terminal of the inverter 121 and the input terminal of the inverter 122, i.e., the node LQ, are coupled through the pass-gate transistor PG1 to the bit line BL carrying a bit line signal. The input terminal of the inverter 121 and the output terminal of the inverter 122, i.e., the node LQB, are coupled through the pass-gate transistor PG2 to the complementary bit line BLB carrying a complementary bit line signal. In various embodiments, a device includes multiple the memory device 10 as memory cells (not shown), and the word line signals in the word lines WL are utilized to select and trigger at least one of the memory cells for a write/read operation of the device. When a memory cell is not selected in response to the word line signals in the word lines WL, the memory cell maintains the same voltage levels on the node LQ and the node LQB.

In operation of the memory device 10, the latch circuit 120 is configured to store a bit data at the node LQ in response to a word line signal in the word line WL. For example, in some embodiments, a voltage level on the node LQ is able to be configured at different voltage levels. The voltage level of the node LQ represents logic "1" or logic "0" corresponding to bit data stored in the memory device 10. The node LQB has a logical level opposite to that of the node LQ. During standby mode, the word line WL is not asserted, and the pass-gate transistors PG1-PG2 disconnect the latch circuit 120 from the bit lines BL and BLB. For a read operation, the bit lines BL and BLB are precharged high, and the word line WL is asserted. The stored bit data at node LQ is transferred to the bit line BL, and the bit data at node LQB is transferred to the bit line BLB. For a write operation, the value to be written is provided at the bit line BL, and the complement of that value is provided at the bit line BLB, when the word line WL is asserted.

In some embodiments, the transistors PG1-PG2, PU1-PU2, and PD1-PD2 in the memory device 10 are formed in one or more active areas of a semiconductor substrate using various technologies. For example, the transistors PG1-PG2, PU1-PU2, and PD1-PD2 are formed as bulk planar metal oxide field effect transistors ("MOSFETs"), bulk finFETs having one or more fins or fingers, semiconductor on insulator ("SOI") planar MOSFETs, SOI finFETs having one or more fins or fingers, or combinations thereof. Gate structures of the devices include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof. The details of structural arrangements of the transistors PG1-PG2, PU1-PU2, and PD1-PD2 are discussed with reference to FIGS. 2-11 in the following paragraphs.

The configurations of FIG. 1 are given for illustrative purposes. Various implements are within the contemplated scope of the present disclosure. For example, in some embodiments, the pass-gate transistors PG1 and PG2 are implemented as PMOS transistors.

Figure 2:
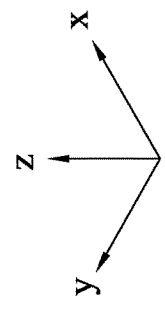
FIG. 2 is a schematic circuit diagram of the memory device corresponding to that in FIG. 1, in accordance with some embodiments.

Reference is now made to FIG. 2. FIG. 2 is a schematic circuit diagram of the memory device 10 corresponding to that in FIG. 1, in accordance with some embodiments. For illustration, the pass circuit 110 including the pass-gate transistors PG1 and PG2 are arranged in a semiconductor layer 11, and the latch circuit 120 is arranged in a semiconductor layer 12 separated from the semiconductor layer 11 in z direction. In some embodiments, the semiconductor layer 12 is above the semiconductor layer 11. In some embodiments, the pass-gate transistors PG1 and PG2 of the pass circuit 110 are formed in and/or over a semiconductor substrate (not shown) by using front-end semiconductor fabrication processes, which are referred to as front end of line (FEOL) processes. The latch circuit 120 is formed over the semiconductor substrate by using back-end semiconductor fabrication processes, which are referred to as back end of line (BEOL) processes.

The configurations of FIG. 2 are given for illustrative purposes. Various implements are within the contemplated scope of the present disclosure. For example, in some embodiments, the pass-gate transistors PG1 and PG2 are arranged in a semiconductor layer 12, and the latch circuit 120 is arranged in the semiconductor layer 11.

Figure 3A:
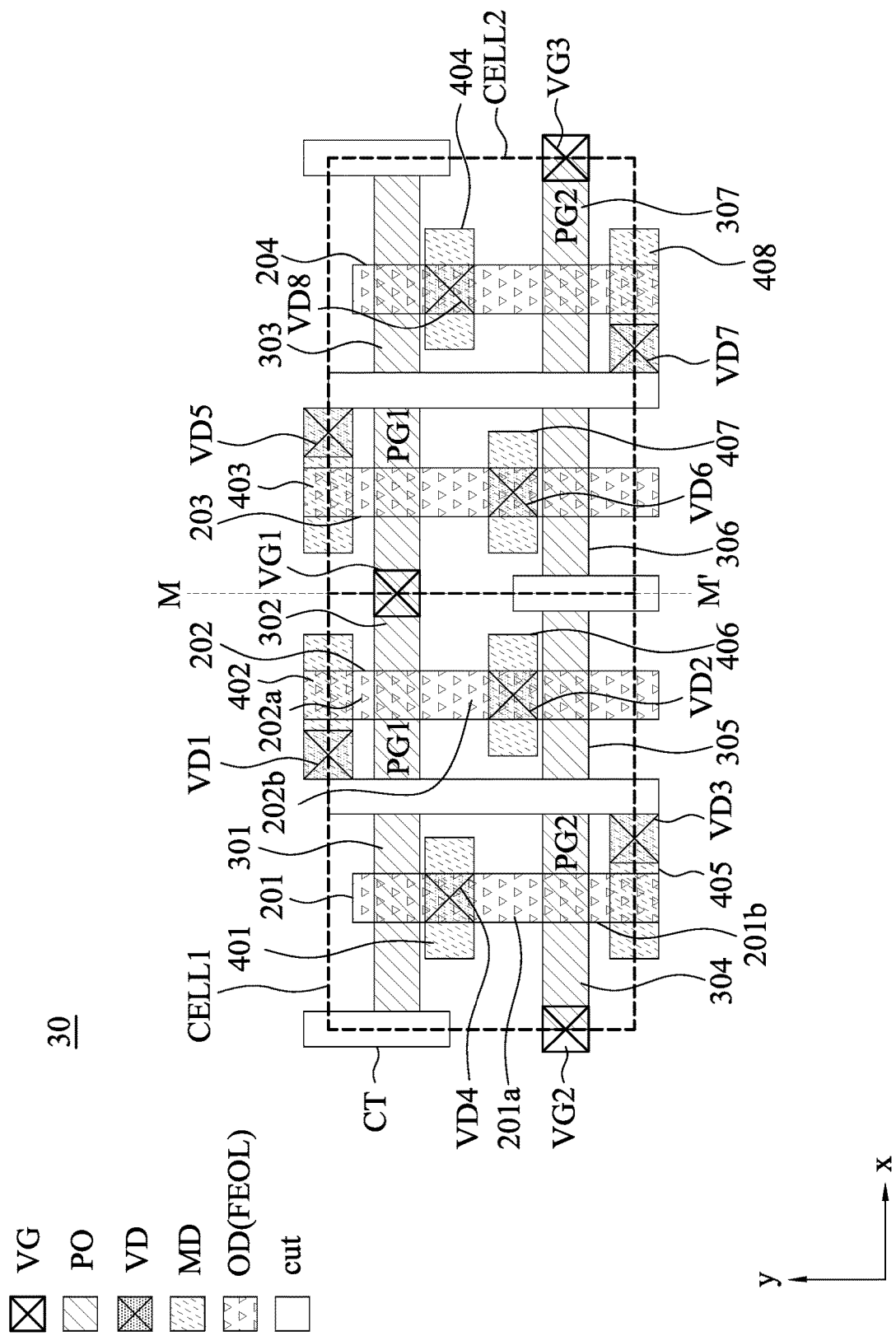
FIGS. 3A-3B are layout diagrams in a plan view of a section of a device corresponding to the memory device in FIGS. 1-2, in accordance with some embodiments.
Figure 3B:
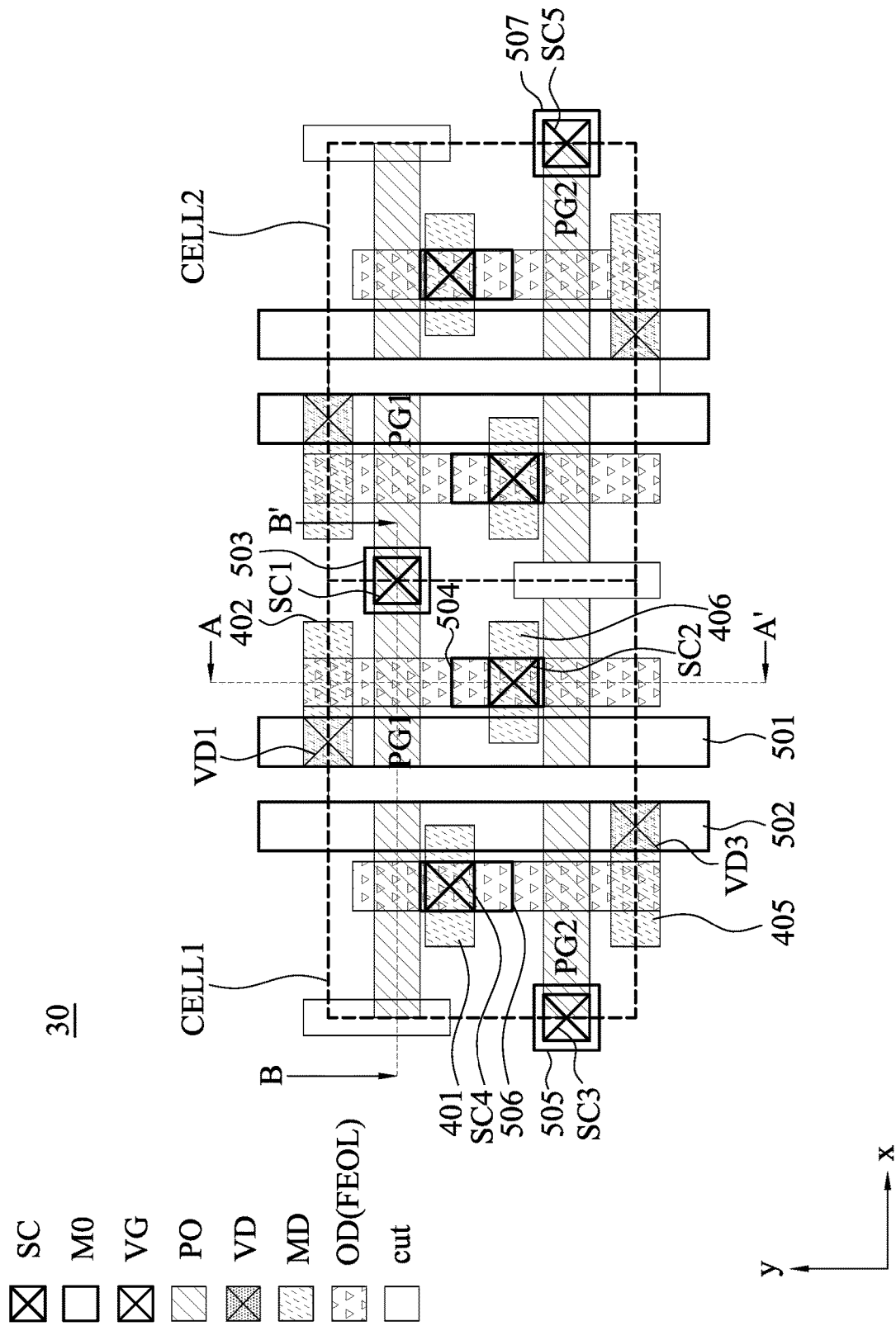

Reference is now made to FIGS. 3A-3B. FIGS. 3A-3B are layout diagrams in a plan view of a section of a device 30 corresponding to the memory device 10 in FIGS. 1-2, in accordance with some embodiments. As shown in FIG. 3A, the device 30 includes memory cells CELL1-CELL2, in which the memory cell CELL2 is a mirror image of the memory cell CELL1 with respect to an imaginary line MM' extending in x direction. Each of the memory cells CELL1-

CELL2 corresponds to the memory device 10 shown in FIGS. 1-2. The configurations of the memory cell CELL2 is similar to that in the memory cell CELL1. Hence, the repetitious descriptions are omitted here.

FIG. 3A depicts a section of the pass-gate transistors PG1-PG2 in the pass circuit 110 in the semiconductor layer 11 shown in FIG. 2. For illustration, the device 30 includes active areas (e.g., oxide-diffusion, OD) 201-204, gate structures (e.g., polysilicon, PO) 301-307, conductive segments (e.g., metal on oxide-definition areas ("MOOD" or "MD")) 401-408, and vias VD1-VD8, VG1-VG3. In some embodiments, in the semiconductor layer 11, the active areas 201-204 are arranged in a first sub-layer. The gate structures 301-307 and conductive segments 401-408 are arranged in a second sub-layer above the first sub-layer. The vias VD1-VD8 and VG1-VG3 are arranged above the second sub-layer.

In some embodiments, the conductive segment 401 corresponds to the source terminal of the pass-gate transistor PG2, and the conductive segment 405 corresponds to the drain terminal of the pass-gate transistor PG2. The gate structure 302 corresponds to gate terminals of the pass-gate transistors PG1 in the memory cells CELL1. The conductive segment 402 corresponds to the source terminal of the pass-gate transistor PG1. The conductive segment 406 corresponds to the drain terminal of the pass-gate transistor PG1. The gate structure 304 corresponds to the gate terminal of the pass-gate transistor PG2. In some embodiments, the gate structures 301, 303, and 305-307 are referred to as dummy gates, in which in some embodiments, the "dummy" gates are referred to as being not electrically connected as the gates for MOS devices, having no operational function in the circuit.

For illustration, as shown in FIG. 3A, the active areas 201-202 in the memory cell CELL1 and the active areas 203-204 in the memory cell CELL2 extend in y direction and are separated from each other in x direction. In some embodiments, active regions 201a-201b of the active area 201 are included in structures as the source and drain terminals of the pass-gate transistor PG2 respectively. Active regions 202a-202b of the active area 202 extend in y direction and are included in structures as the drain and source terminals of the pass-gate transistor PG1 respectively. In some embodiments, the active areas 201-204 are of N conductivity type.

The gate structures 301-307 extend in x direction. Specifically, the gate structures 301 and 304 cross the active area 201 in the memory cell CELL1, while the gate structures 303 and 307 cross the active area 204 in the memory cell CELL2. The gate structure 302 extends from the memory cell CELL1 to the memory cell CELL2 to cross the active areas 202-203, and is separated from the gate structures 301 and 303 by cut layers CT. The gate structures 305 and 306 cross the active areas 202 and 203 respectively, and are separated from each other by a cut layer. The via VG1 is coupled to the gate structure 302, the via VG2 is coupled to the gate structure 304, and the via VG3 is coupled to the gate structure 307.

The conductive segments 401-408 extend in x direction. For illustration, the conductive segments 401 and 405 cross the active area 201, while the vias VD4 and VD3 are coupled to the conductive segments 401 and 405 respectively. The conductive segments 402 and 406 cross the active area 202, while the vias VD1 and VD2 are coupled to the conductive segments 402 and 406 respectively. Moreover, the conductive segment 401 is arranged between the gate structures 301 and 304, and the conductive segment 406 is arranged between the gate structures 302 and 305.

As illustratively shown in FIG. 3B, the device 30 further includes conductive lines (e.g., metal-zero layer, MO) 501-507 and contact vias SC1-SC5. The conductive lines 501-507 extend in y direction in a third sub-layer above the second sub-layer. In some embodiments, the conductive line 501 corresponds to the bit line BL and is coupled to the conductive segment 402 through the via VD1. Accordingly, the bit line BL is coupled to the drain terminal of the pass-gate transistor PG1. Similarly, the conductive line 502 corresponds to the bit line BLB and is coupled to the conductive segment 405 through the via VD3. Accordingly, the bit line BLB is coupled to the drain terminal of the pass-gate transistor PG2.

With reference to both FIGS. 3A-3B, the conductive line 503 is coupled between the via VG1 and the contact via SC1. The conductive line 504 is coupled between the via VD2 and the contact via SC2. The conductive line 505 is coupled between the via VG2 and the contact via SC3. The conductive line 506 is coupled between the via VD4 and the contact via SC4. The conductive line 507 is coupled between the via VG3 and the contact via SC5. In some embodiments, the contact vias SC1-SC5 are arranged above the conductive lines 503-507 and extend from the third sub-layer in the semiconductor layer 11 to be coupled to components in the semiconductor layer 12. The details of the contact vias SC1-SC5 will be discussed with reference to FIGS. 4A-7.

Figure 4A:
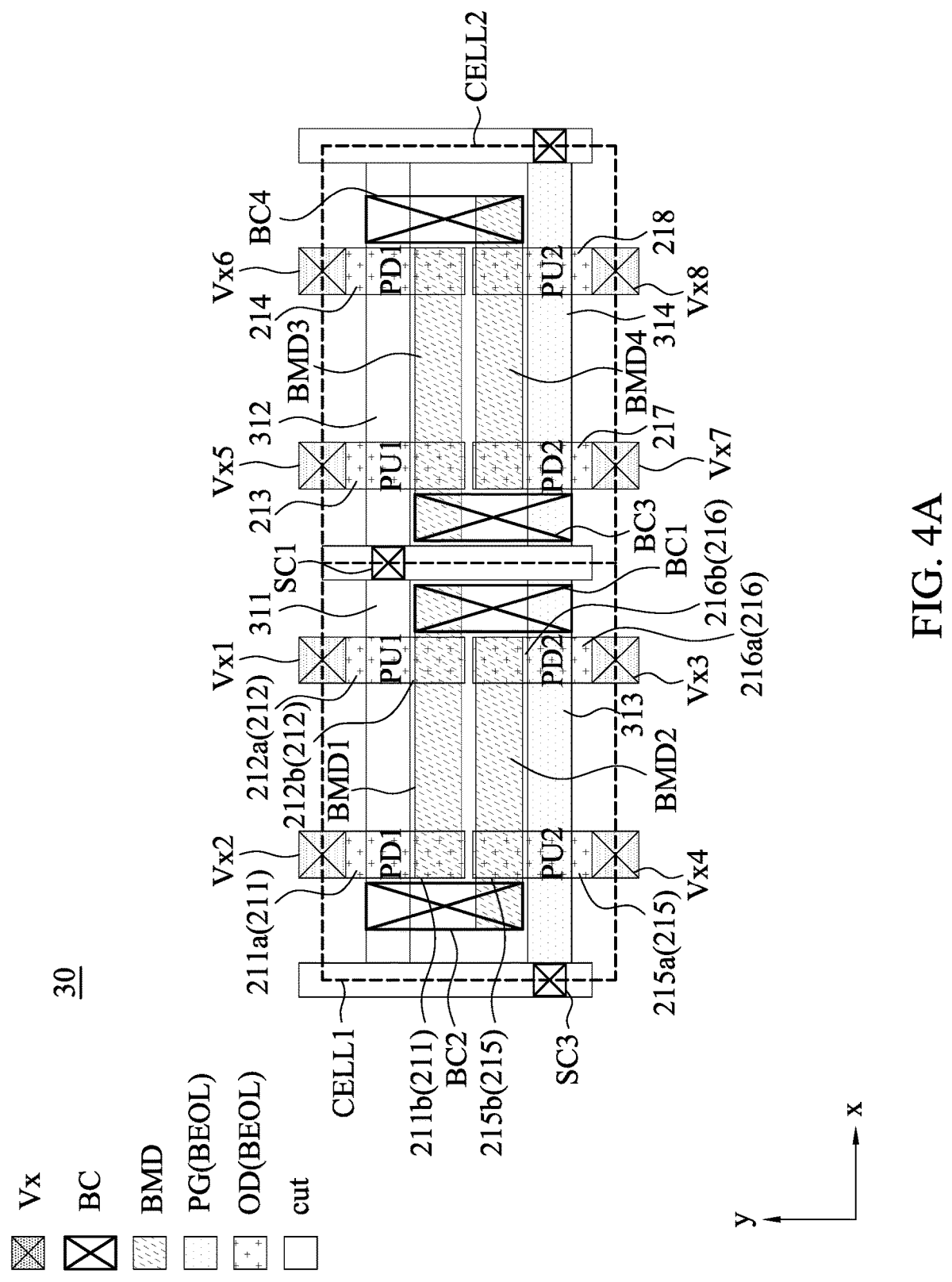
Figure 4B:
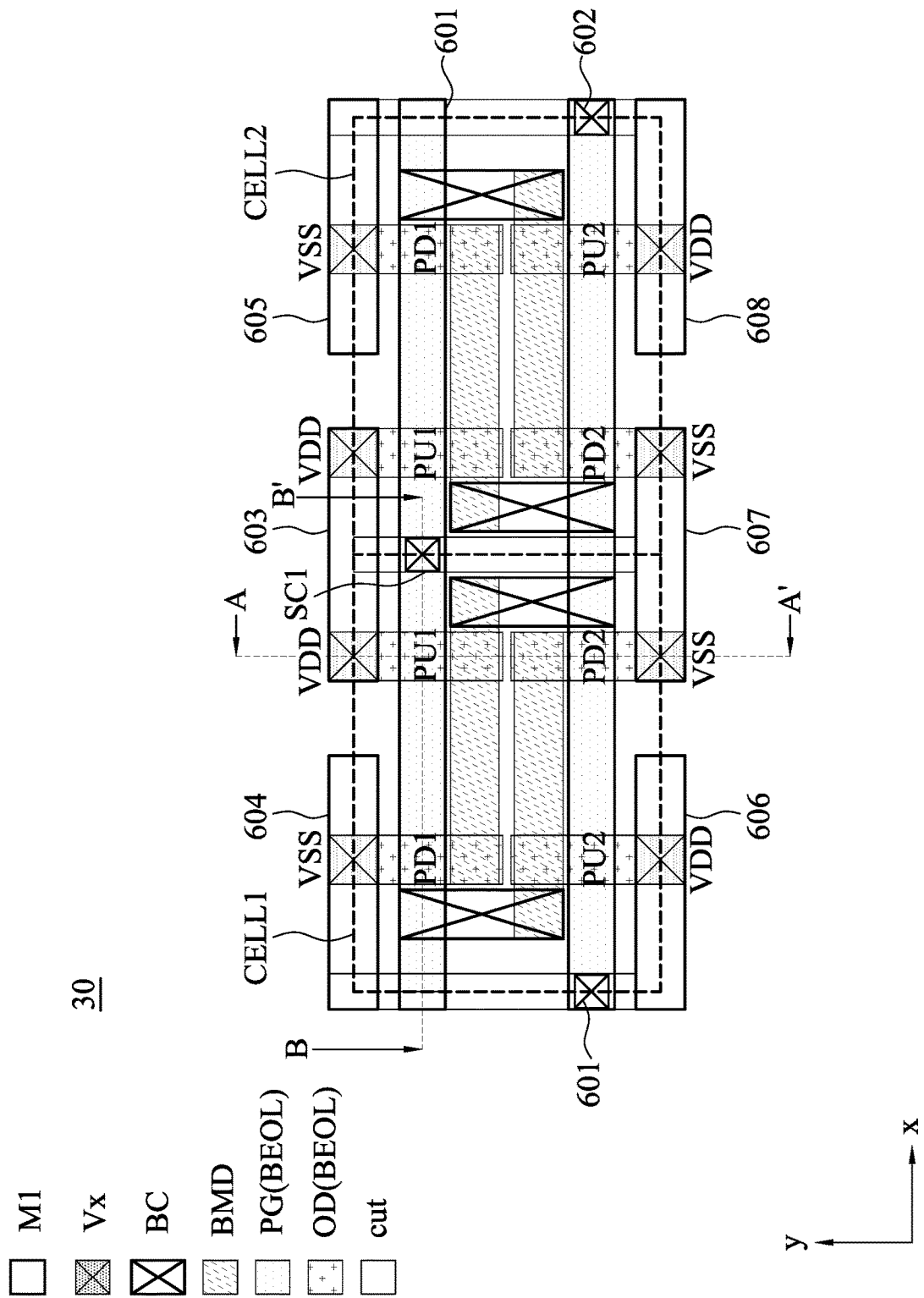
Figure 4C:
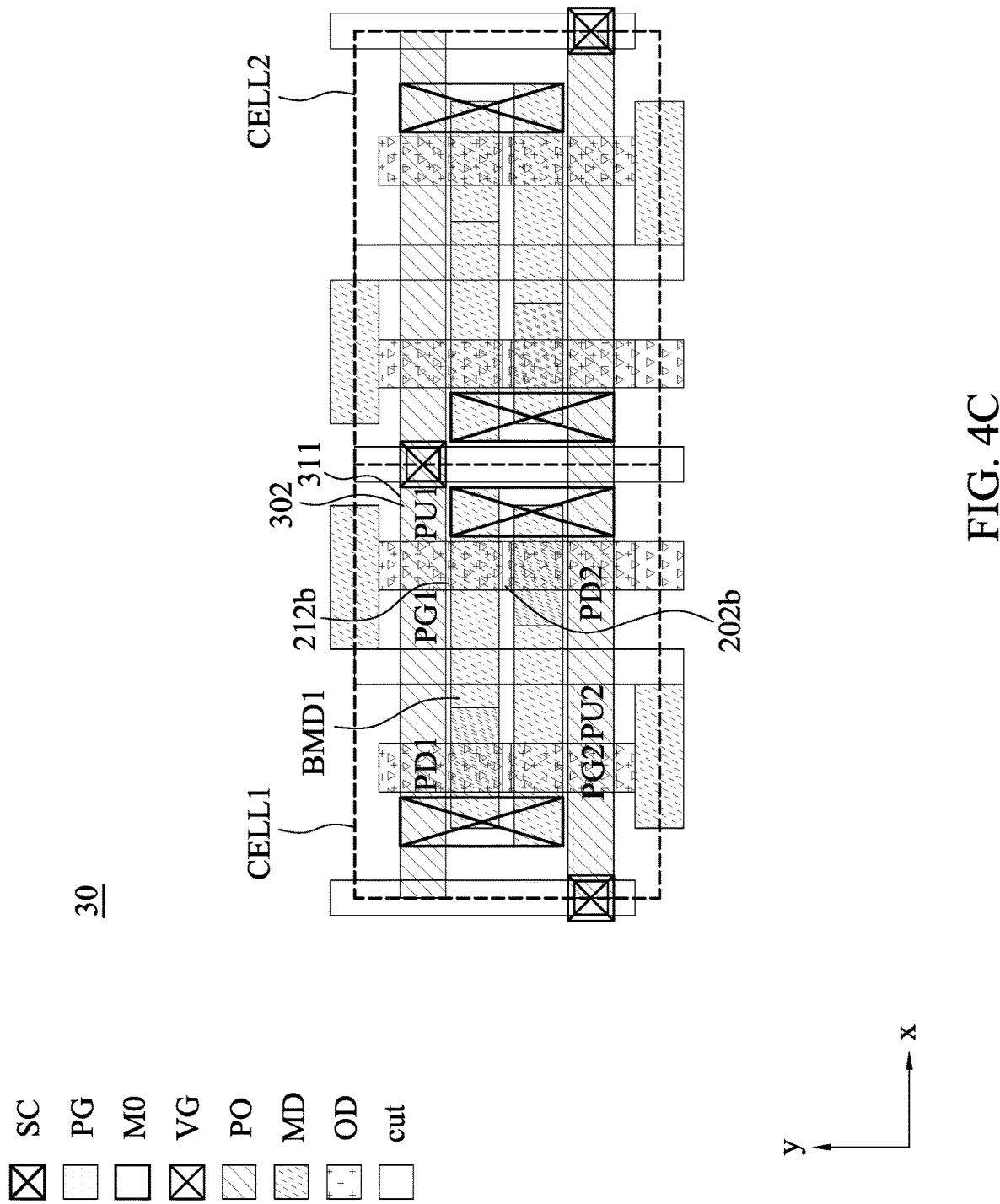

Reference is now made to FIGS. 4A-4C. FIGS. 4A-4C are layout diagrams in a plan view of a section of the device 30 corresponding to the memory device 10 in FIGS. 1-2, in accordance with some embodiments. The configurations of the memory cell CELL2 is similar to that in the memory cell CELL1. Hence, the repetitious descriptions are omitted here.

FIG. 4A depicts a section of the pull-up transistors PU1-PU2 and the pull-down transistors PD1-PD2 in the latch circuit 120 in the semiconductor layer 12 shown in FIG. 2. For illustration, the device 30 includes active areas 211-218, gate structures (e.g., PG) 311-314, body conductive segments (BMD) BMD1-BMD4, body contact BC1-BC4, and vias Vx1-Vx8. In some embodiments, in the semiconductor layer 12, the active areas 211-218 are arranged in a first sub-layer in the semiconductor layer 12. The gate structures 311-314 and the body conductive segments BMD1-BMD4 are arranged in a second sub-layer above the first sub-layer. The body contact BC1-BC4 and the vias Vx1-Vx8 are arranged above the second sub-layer. In some embodiments, the device 30 further includes conductive segments (not shown) coupled between the active areas 211-218 and the vias Vx1-Vx8.

In some embodiments, the gate structure 311 is shared by the pull-up transistor PU1 and the pull-down transistor PD1 and corresponds to the gate terminals thereof. The active region 212a of the active area 212 is included in a structure as the source terminal of the pull-up transistor PU1. The active region 211a of the active area 211 is included in a structure as the source terminal of the pull-down transistor PD1. The body conductive segment BMD1 corresponds to the drain terminals of the pull-up transistor PU1 and the pull-down transistor PD1. Alternatively stated, the active regions 212b and 211b are included in a structure as the terminal of the inverter 122.

The gate structure 313 is shared by the pull-up transistor PU2 and the pull-down transistor PD2 and corresponds to the gate terminals thereof. The active region 215a of the active area 215 is included in a structure as the source terminal of the pull-up transistor PU2. The active region 216a of the active area 216 is included in a structure as the source terminal of the pull-down transistor PD2. The body conductive segment BMD2 corresponds to the drain terminals of the pull-up transistor PU2 and the pull-down transistor PD2.

For illustration, as shown in FIG. 4A, the active areas 211-218 extend in y direction. In the memory cell CELL1, the active areas 211 is separated from the active area 215 in y direction, and the active areas 212 is separated from the active area 216. In some embodiments, the active areas 211, 214, 216, and 217 are of N conductivity type. In some embodiments, the active areas 212, 213, 215, and 218 are of P conductivity type.

The gate structures 311-314 extend in x direction. In some embodiments, the gate structure 311 crosses the active areas 211-212, and the gate structure 313 crosses the active areas 215-216. The gate structures 311-312 are separated from each other by the cut layer CT, and the gate structures 313-314 are separated from each other by the cut layer CT.

The body conductive segments BMD1-BMD4 extend in x direction. The body conductive segment BMD1 crosses and couples with the active region 211b of the active area 211 and the active region 212b of the active area 212. The body conductive segment BMD2 crosses and couples with the active region 215b of the active area 215 and the active region 216b of the active area 216.

The body contacts BC1-BC4 extend in y direction. The body contact BC1 crosses the body conductive segment BMD1 and is configured to couple the body conductive segment BMD1 to the gate structure 313. Similarly, the body contact BC2 crosses the body conductive segment BMD2 and is configured to couple the body conductive segment BMD2 to the gate structure 311.

With reference to FIGS. 1, 3A-4A and 5A together, FIG. 5A is cross-sectional view of the layout diagram of the device 30 along lines AA'. The contact via SC2 is configured to couple the source terminal of the pass-gate transistor PG1 with the node LQ (the terminal of the latch circuit 120.) Specifically, in FIGS. 3A-3B, the conductive segment 406 disposed on the active region 202b is coupled to the conductive line 504 by the via VD2. The contact via SC2 couples the conductive line 504 to the active region 216b in FIG. 4A. Accordingly, the source terminal of the pass-gate transistor PG1 is coupled to the drain terminals of the pull-up transistor PU2 and pull-down transistor PD2, and further coupled to the gate terminals, corresponding to the node LQ as the terminal of the latch circuit 120, of the pull-up transistor PU1 and pull-down transistor PD1 through the body contact BC2.

Similarly, for the pass-gate transistor PG2, the conductive segment 401 disposed on the active region 201a is coupled to the conductive line 506 by the via VD4, as shown in FIGS. 3A-3B. The contact via SC4 couples the conductive line 506 to the active region 211b in FIG. 4A. Accordingly, the source terminal of the pass-gate transistor PG2 is coupled to the drain terminals of the pull-up transistor PU1 and pull-down transistor PD1, and further coupled to the gate terminals, corresponding to the node LQB as another terminal of the latch circuit 120, of the pull-up transistor PU2 and pull-down transistor PD2 through the body contact BC1.

With reference to FIG. 4B, the device 30 further includes conductive lines 601-608 extending in the x direction in a layer above the semiconductor layer 12. For illustration, conductive lines 601-602 are shared by the memory cells CELL1-CELL2, and are arranged between the conductive lines 603-605 and 606-608.

In some embodiments, with reference to FIGS. 4A-4B and 5A, the conductive line 603 is configured to receive the high-voltage source VDD for the memory cells CELL1-CELL2 by coupling to the vias Vx1 and Vx5 respectively. The conductive lines 604 and 604 are configured to receive the low-voltage source VSS and the high-voltage source VDD for the memory cell CELL1 by coupling to the vias Vx4 and Vx3 respectively. The conductive lines 605 and 608 are configured to receive the low-voltage source VSS and the high-voltage source VDD for the memory cell CELL2 by coupling to the vias Vx6 and Vx8 respectively.

In some embodiments, the conductive lines 601-602 correspond to the word line WL in FIG. 1. With reference to FIGS. 1-4B and 5B, FIG. 5B is cross-sectional view of the layout diagram of the device 30 along lines BB'. The contact via SC1 is configured to couple the conductive line 601 to the gate terminal (i.e., the gate structure 302) of the pass-gate transistor PG1 to transmit the word line signal in the conductive line 601. Accordingly, the pass-gate transistor PG1 is configured to be turned on to transmit the bit data in response to the word line signal transmitted in the conductive line 601.

Similarly, the contact via SC3 is configured to couple the conductive line 602 to the gate terminal (i.e., the gate structure 304) of the pass-gate transistor PG2 to transmit the word line signal in the conductive line 602. Accordingly, the pass-gate transistor PG2 is configured to be turned on to transmit the bit data in response to the word line signal transmitted in the conductive line 602.

Moreover, the contact via SC5 is configured to couple the conductive line 602 to the gate terminal (i.e., the gate structure 307) of the pass-gate transistor PG2 in the memory cell CELL2 to transmit the word line signal in the conductive line 602. Accordingly, the pass-gate transistor PG2 in the memory cell CELL2 is configured to be turned on to transmit the bit data in response to the word line signal transmitted in the conductive line 602.

In addition, as shown in FIGS. 5A-5B, an insulating layer 700 is disposed between the active regions 202a, 202b, 212a, and 216a. In some embodiments, the insulating layer 700 is disposed to separate the gate structures 301 and 311 as shown in FIG. 5B.

FIG. 4C depicts a layout diagram including the semiconductor layers 11-12 of the device 30. As shown in FIG. 4C, the pass-gate transistor PG1 overlaps the pull-up transistor PU1 in the layout view. The pass-gate transistor PG2 overlaps the pull-up transistor PU2 in the layout view. Specifically, in the layout view, the gate structure 302 of the pass-gate transistor PG1 overlaps the gate structure 311 of the pull-up transistor PU1, and the active region 212b of the pull-up transistor PU1 overlaps the active region 202b of the pass-gate transistor PG1. In addition, the body conductive segment BMD1 configured as the terminal of the inverter 122 overlaps the active region 202b as shown in FIG. 4C.

In some approaches, pass-gate transistors, pull-up transistors, and pull-down transistors are formed in a same semiconductor layer in a memory device. As distances between epitaxial layers reduce for scaling the device down, numerous merge issues between epitaxial layers, such like, P type doped layers and N type doped layers, occurs, which at least causes manufacturing yield loss. Compared with some approaches, with the configurations of the present disclosure, by arranging the pass-gate transistors PG1-PG2, the pull-up transistors PU1-PU2, and the pull-down transistors PD1-PD2 in different layers that vertically separated from each other, the area of the device shrinks without suffering merge problems.

The configurations of FIGS. 3A-5B are given for illustrative purposes. Various implements are within the contemplated scope of the present disclosure. For example, in some embodiments, the memory cell CELL2 is omitted in the device. In various embodiments, when the pass-gate transistors PG1-PG2 are arranged above the transistors PU1-PU2 and PD1-PD2, the contact via SC2 is arranged on the body conductive segment BMD2 and extends to couple the active region 202b. Similarly, the contact via SC4 is arranged on the body conductive segment BMD1 and extends to couple the active region 211b. Furthermore, in various embodiments, gate structures of the transistors PD1-PD2, PU1-PU2, and PG1-PG2 are formed around channel regions of the transistors PD1-PD2, PU1-PU2, and PG1-PG2, in which the channel regions include, for example, structures of round/square wire, nanoslab, nano-sheet, multi-bridge channel, nano-ring or any other suitable kinds of the nano structures, and the corresponding active regions as drain and source regions are adjusted accordingly.

Figure 6:
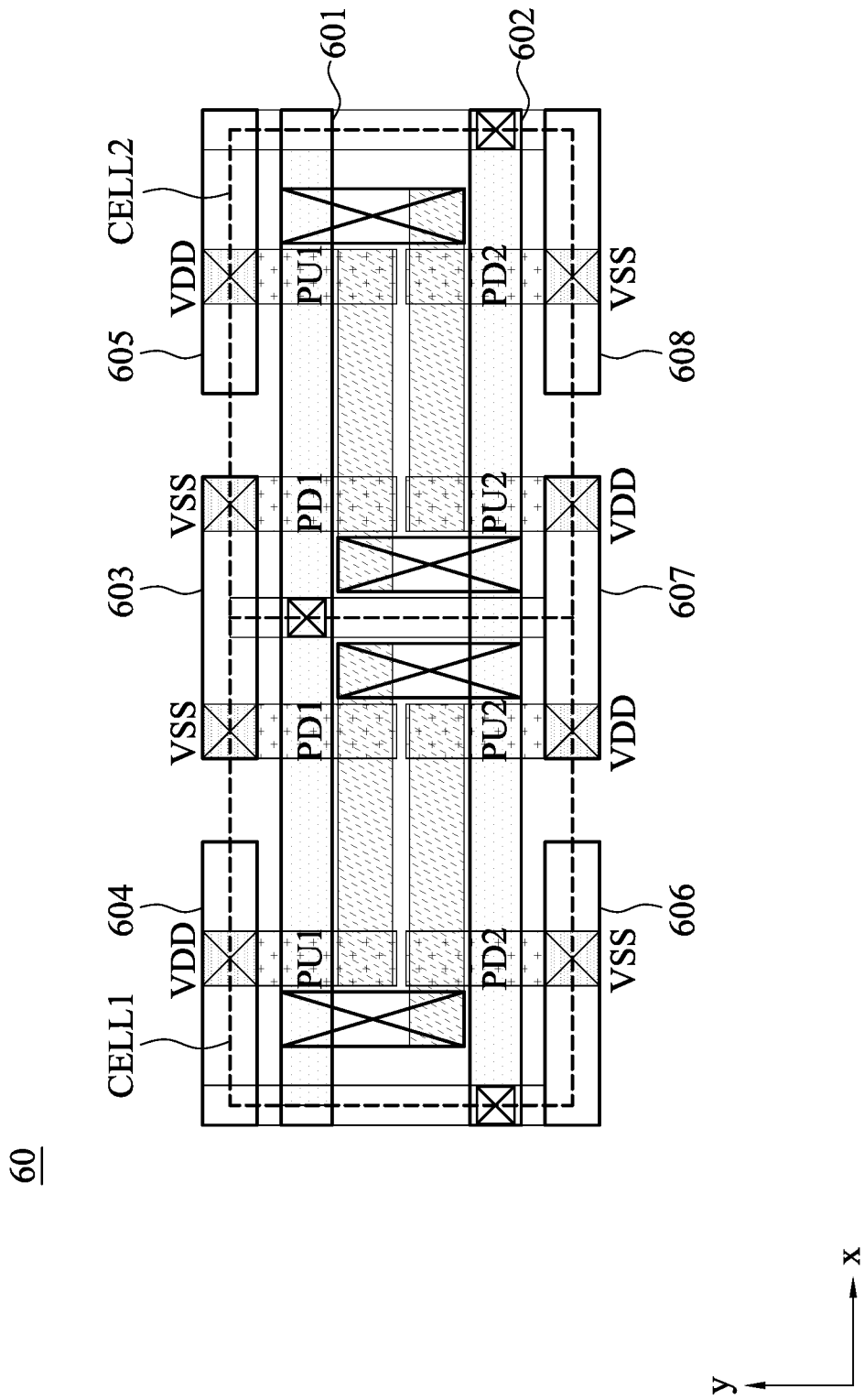
FIG. 6 is layout diagram in a plan view of a section of a device corresponding to the memory device in FIGS. 1-2 and the device in FIGS. 3A-4C, in accordance with another embodiment.

Reference is now made to FIG. 6. FIG. 6 is layout diagram in a plan view of a section of a device 60 corresponding to the memory device 10 in FIGS. 1-2 and the device 30 in FIGS. 3A-4C, in accordance with another embodiment. With respect to the embodiments of FIGS. 1-5B, like elements in FIG. 6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6.

Compared with the embodiments of FIG. 4B, instead of the conductive lines 604-605 and 607 configured to receive the low-voltage source VSS and the conductive lines 603, 606, 608 configured to receive the high-voltage source VDD, the conductive lines 604-605 and 607 receive the high-voltage source VDD and the conductive lines 603, 606, 608 receive the low-voltage source VSS. The corresponding positions of the pull-up transistor PU1 and the pull-down transistor PD1 alter with each other, and the corresponding positions of the pull-up transistor PU2 and the pull-down transistor PD2 alter with each other, as shown in FIG. 6. Alternatively stated, with reference to FIGS. 3A and 6 together, the pass-gate transistor PG1 overlaps the pull-down transistor PD1, and the pass-gate transistor PG2 overlaps the pull-down transistor PD2 in the layout view. The configurations of the memory cell CELL2 are similar to that of the memory cell CELL1. Hence, the repetitious descriptions are omitted here.

The configurations of FIG. 6 are given for illustrative purposes. Various implements are within the contemplated scope of the present disclosure. For example, in some embodiments, the configurations of the memory cell CELL2 in FIG. 6 is the same as that in FIG. 4C while each of the conductive lines 603 and 607 is divided into two conductive lines to provide different voltages to the memory cell CELL2, the conductive line 605 receives the low-voltage source VSS, and the conductive line 608 receives the high-voltage source VDD.

Figure 7:
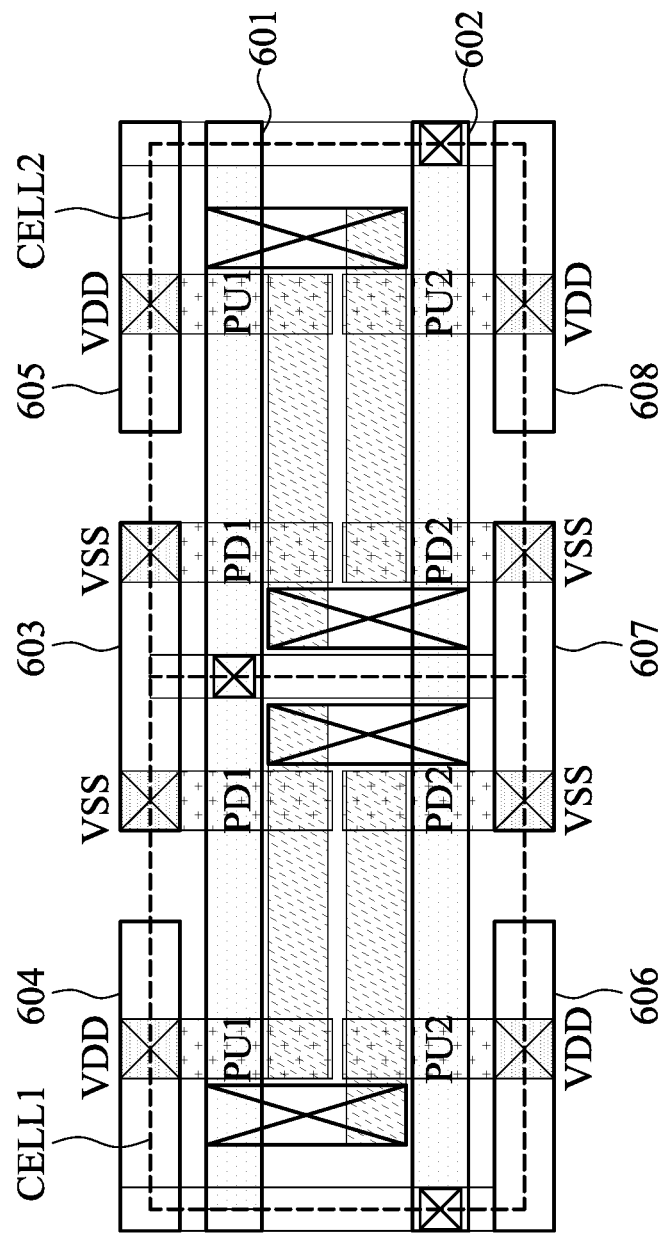
FIG. 7 is layout diagram in a plan view of a section of a device corresponding to the memory device in FIGS. 1-2 and the device in FIGS. 3A-4C, in accordance with another embodiment.

Reference is now made to FIG. 7. FIG. 7 is layout diagram in a plan view of a section of a device 70 corresponding to the memory device 10 in FIGS. 1-2 and the device 30 in FIGS. 3A-4C, in accordance with another embodiment. With respect to the embodiments of FIGS. 1-6, like elements in FIG. 7 are designated with the same reference numbers for ease of understanding.

Compared with the embodiments of FIG. 4B, the conductive lines 604-606 and 608 receive the high-voltage source VDD and the conductive lines 603, 607 receive the low-voltage source VSS. The corresponding positions of the pull-up transistor PU1 and the pull-down transistor PD1 alter with each other. Alternatively stated, with reference to FIGS. 3A and 6 together, the pass-gate transistor PG1 overlaps the pull-down transistor PD1. The configurations of the memory cell CELL2 are similar to that of the memory cell CELL1. Hence, the repetitious descriptions are omitted here.

The configurations of FIG. 7 are given for illustrative purposes. Various implements are within the contemplated scope of the present disclosure. For example, in some embodiments, the configurations of the memory cell CELL2 in FIG. 7 is the same as that in FIG. 4C while each of the conductive lines 603 and 607 is divided into two conductive lines to provide different voltages to the memory cell CELL2, the conductive line 605 receives the low-voltage source VSS, and the conductive line 608 receives the high-voltage source VDD.

Figure 8:
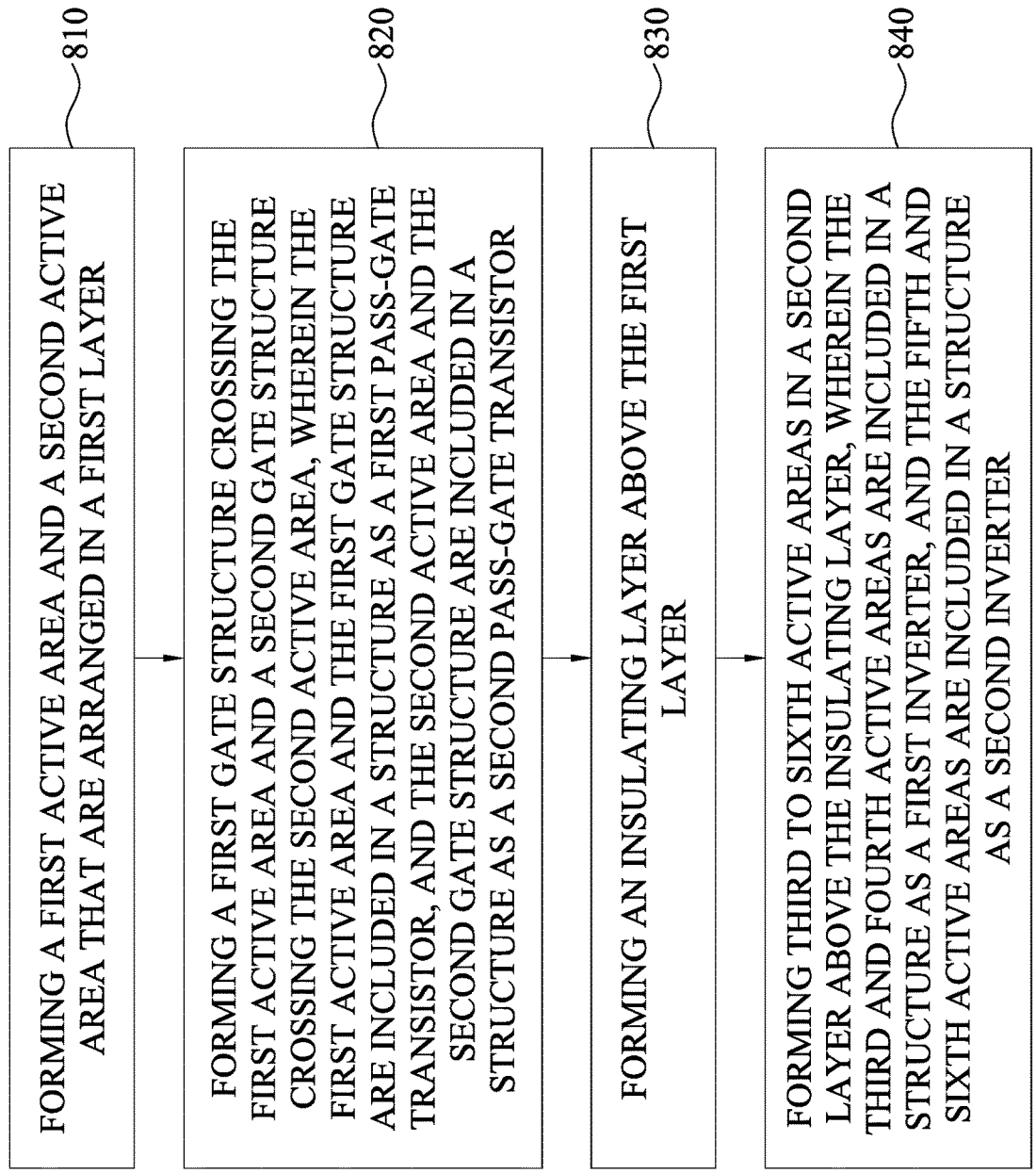
FIG. 8 is a flow chart of a method of manufacturing a device, in accordance with some embodiments.

Reference is now made to FIG. 8. FIG. 8 is a flow chart of a method 800 of manufacturing a device corresponding to FIGS. 1-7, in accordance with some embodiments. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements. The method 800 includes operations 810, 820, 830, and 840, and will be discussed with reference to FIGS. 1-4C.

In operation 810, as shown in FIG. 3A, the active areas 201-202 are formed to be arranged in the semiconductor layer 11.

In operation 820, the gate structure 304 crossing the active area 201 and the gate structure 302 crossing the active area 202. In some embodiments, the active area 201 and the gate structure 304 are included in a structure as the pass-gate transistor PG2. The active area 202 and the gate structure 302 are included in a structure as the pass-gate transistor PG1.

In some embodiments, as the embodiments shown in FIGS. 3A-4C, the active areas 201-202 are of N conductivity type. The active areas 211 and 216 are of N conductivity type, and the active areas 212 and 215 are of P conductivity type.

In operation 830, the insulating layer 700 as shown in FIGS. 5A-5B is formed above the semiconductor layer 11.

In operation 840, the active areas 211-212 and 215-216 are formed in the semiconductor layer 12 above the semiconductor layer 11. In some embodiments, the active areas 215-216 are included in a structure as the inverter 121. The active areas 211-212 are included in a structure as the inverter 122. The inverters 121-122 are coupled between the pass-gate transistors PG1-PG2 as shown in FIG. 1. Accordingly, as shown in FIGS. 3A-5B, the gate structure 304 is arranged between the active areas 201 and 215. The gate structure 302 is arranged between the active areas 202 and 215.

In some embodiments, the method 800 further includes operations of forming in the semiconductor layer 12 the gate structure 313 crossing the active areas 215-216; and forming in the semiconductor layer 12 the gate structure 311 crossing the active areas 211-212. In the layout view, the gate structure 304 overlaps the gate structure 313, and the gate structure 302 overlaps the gate structure 311.

In some embodiments, the method 800 further includes operations of forming the conductive lines 501-502 extending in a y direction in the layer between the semiconductor layers 11-12. The conductive lines 501-502 are coupled to the pass-gate transistors PG1-PG2 respectively as shown in FIG. 3B.

In some embodiments, the method 800 further includes operations of forming the conductive lines 601-602 extending in x direction in the layer above the semiconductor layer 12. The conductive lines 601-602 are coupled to gate terminals of the pass-gate transistors PG1-PG2.

Figure 9:
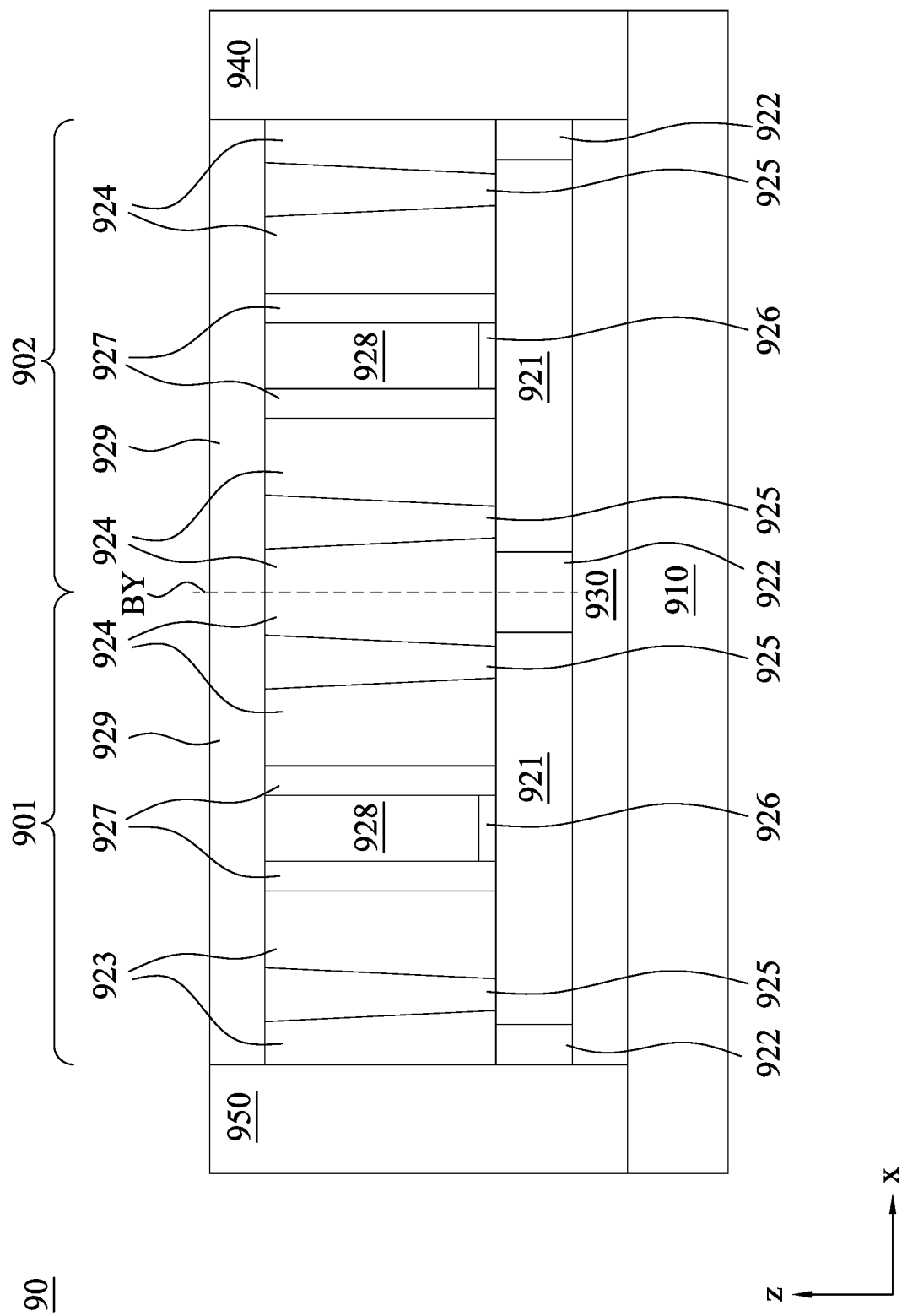
FIG. 9 is a cross-sectional view of a device in FIGS. 1-2, in accordance with some embodiments.

Reference is now made to FIG. 9. FIG. 9 is a cross-sectional view of a device 90 in FIGS. 1-2, in accordance with some embodiments. For illustration, the device 90 includes a structure 910 which corresponds to the pass circuit 110 formed in the semiconductor layer 11 of FIG. 2 in some embodiments. In some embodiments, the structure 910 is manufactured in the front end of line (FEOL) processes. An insulating layer 930 is formed over the structure 910. In some embodiments, the insulating layer 930 corresponds to the insulating layer 700 in FIGS. 5A-5B. In some embodiments, the components disposed above the insulating layer 930 correspond to the latch circuit 120 formed in the semiconductor layer 12 of FIG. 2.

The device 90 further includes doped regions 921 separated from shallow trench isolation (STI) regions 922. In some embodiments, the doped region 921 are formed in amorphous silicon or amorphous silicon carbide material and doped by using a dopant implantation process to have the N and P conductivity types. In some embodiments, the doped region 921 in a portion 901 has P conductivity type and the doped region 921 in a portion 902 has N conductivity type. The portions 901-902 are separated from each other by a boundary BY. Moreover, in some embodiments, the doped regions 921 are patterned by using mask patterns as etching masks. In various embodiments, well regions (not shown) are surrounded the doped regions 921 and formed by performing ion implantation to implant impurity ions. The shallow trench isolation regions 922 are formed by trench etching using a dry etching method and/or a wet etching method. In some embodiments, the shallow trench isolation region 922 include silicon oxide, silicon nitride, silicon oxynitride, fluoride-doped silicate glass (FSG), a low-K dielectric material, other suitable materials, and/or combinations thereof. In some embodiments, after trench etching to form the shallow trench isolation regions 922, the device 90 undergoes an annealing that provides energy for atoms to rearrange themselves, which results in reduction of stacking faults. The annealing is a laser anneal, and the annealing temperature is equal to or greater than about 400° C.

Gate insulating layers 926 and metal gate regions 928 included in the device 90 are formed over the doped region 921 between spacer regions 927. In some embodiments, the gate insulating layers 926 include one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The metal gate regions 928 include a work function metal component and a fill metal component. The work functional metal component is configured to tune a work function of its corresponding FinFET to achieve a desired threshold voltage Vt. In various embodiments, the work function metal component contains: TiAl, TiAlN, TaCN, TiN, WN, or W, or combinations thereof. The fill metal component is configured to serve as the main conductive portion of the metal gate regions 928. In various embodiments, the fill metal component contains Aluminum (Al), Tungsten (W), Copper (Cu), or combinations thereof. In some embodiments, The gate insulating layers 926 and the metal gate regions 928 are deposited by CVD, PVD, ALD, and/or other suitable processes. Polishing processes such as chemical-mechanical-polishing (CMP) are performed to planarize the upper surface of the metal gate regions 928. The spacer regions 927 are formed by dielectric deposition and dry etching process, in some embodiments.

In some embodiments, source/drain regions (not shown) are formed in the doped regions 921 by various ion implantation processes. Furthermore, in some embodiments source and drain regions include such as lightly doped drain (LDD), heavily doped source and drain portions and also salicide for reduced contact resistance. Whereas in some embodiments, the source and drain regions use silicon epitaxial growth layer with lightly doped phosphorous, heavily doped phosphorous, lightly doped carbon, or both. One or more annealing processes are performed to activate the source/drain regions. For example the annealing is a laser anneal, and the annealing temperature is equal to or greater than about 400° C.

Interlayer dielectric layers (IDL) 923 and 924 are formed above the doped regions 921. Source/drain contact layers 925, corresponding to, for example, the conductive segment 406, are formed over the doped regions 921. In some embodiments, source/drain contact layers 925 include one or more layers of W, Cu, Co, Ni, or silicide thereof, and are formed by, for example, CVD, physical vapor deposition (PVD) including sputtering, atomic layer deposition (ALD), or other suitable film forming methods. Then, a planarization operation, such as an etch-back process and/or a chemical mechanical polishing (CMP) process, is performed.

An interlayer dielectric layer 929 is formed above the interlayer dielectric layers 923, 924, the metal gate regions 928, and spacer regions 927. In some embodiments, an etch-back process and/or a chemical mechanical polishing (CMP) process is performed to remove portions of the interlayer dielectric layer 929 above the metal gate regions 928 and the source/drain contact layers 925 for metal routing.

In some embodiments, the device 90 further includes logic blocks 940-950 that arranged next to the portions 901-902 and manufactured in the BEOL processes, as shown in FIG. 9.

The configurations of FIG. 9 are given for illustrative purposes. Various implements are within the contemplated scope of the present disclosure. For example, in some embodiments, the configurations of the doped regions 921 and the metal gate regions 928 are fin structures.

Figure 10:
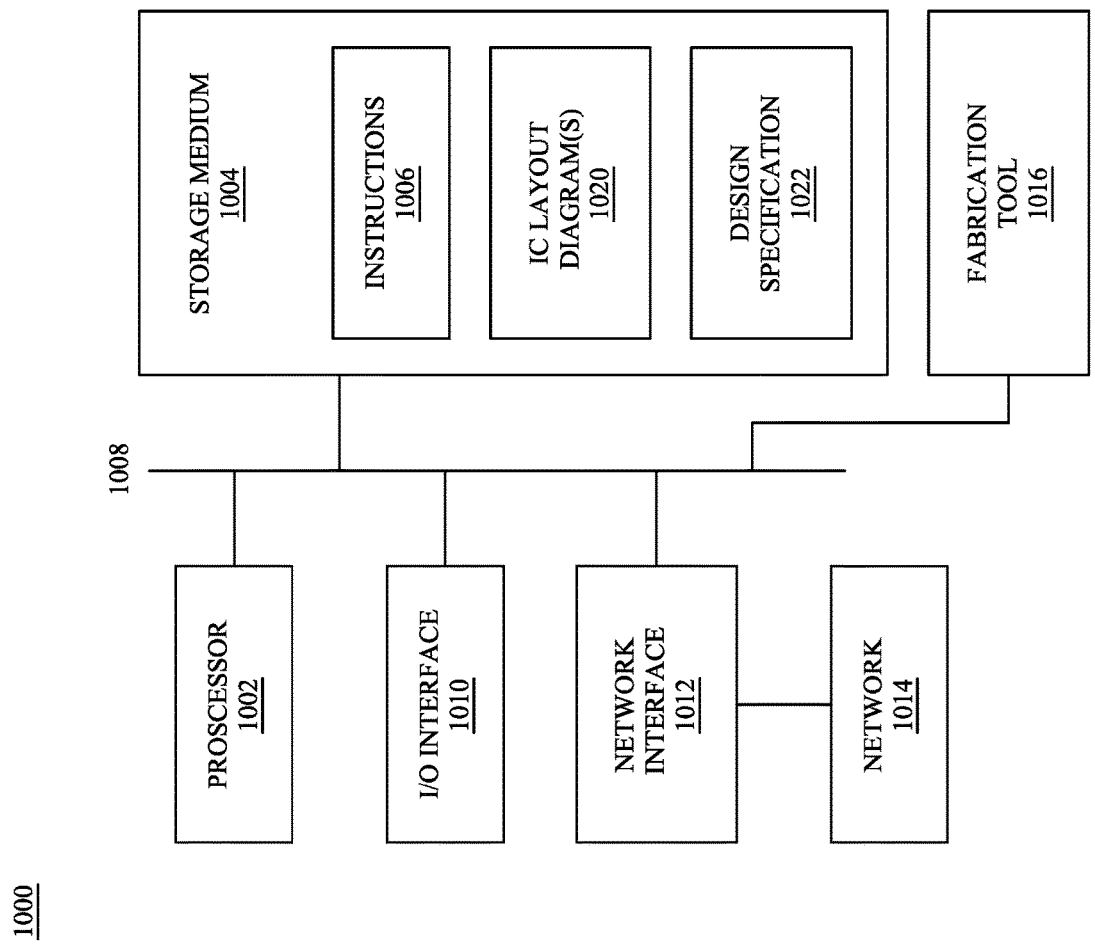
FIG. 10 is a block diagram of a system for designing an integrated circuit layout design, in accordance with some embodiments of the present disclosure.

Reference is now made to FIG. 10. FIG. 10 is a block diagram of an electronic design automation (EDA) system 1000 for designing the integrated circuit layout design, in accordance with some embodiments of the present disclosure. EDA system 1000 is configured to implement one or more operations of the method 800 disclosed in FIG. 8 and further explained in conjunction with FIGS. 1-7. In some embodiments, EDA system 1000 includes an APR system.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code (instructions) 1006, i.e., a set of executable instructions. Execution of instructions 1006 by hardware processor 1002 represents (at least in part) an EDA tool which implements a portion or all of, e.g., the method 800.

The processor 1002 is electrically coupled to computer-readable storage medium 1004 via a bus 1008. The processor 1002 is also electrically coupled to an I/O interface 1010 and a fabrication tool 1016 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. The processor 1002 is configured to execute computer program code 1006 encoded in computer-readable storage medium 1004 in order to cause EDA system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EDA system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores IC layout diagram 1020 of standard cells including such standard cells as disclosed herein, for example, a cell including in the memory cells CELL1-CELL2 included in the device 30, 60, and 70 discussed above with respect to FIGS. 1-7.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows EDA system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1064. In one or more embodiments, a portion or all of noted processes and/or methods, is implemented in two or more systems 1000.

EDA system 1000 also includes the fabrication tool(s) 1016 coupled to processor 1002. The fabrication tools 1016 are configured to fabricate integrated circuits, e.g., the devices 10, 30, 60-70, and 90 illustrated in FIGS. 1-7, according to the design files processed by the processor 1002. In some embodiments, the fabrication tools 1016 perform various semiconductor processes including, for example, generating photomasks based on layouts, fabricating using the photomasks, etching, deposition, implantation, and annealing. The fabrication tools 1016 include, for example, photolithography steppers, etch tools, deposition tools, polishing tools, rapid thermal anneal tools, ion implantation tools, and the like. Each fabrication tool 1016 modifies the wafer according to a particular operating recipe. For illustration, one fabrication tool 1016 is configured to deposit a film having a certain thickness on a wafer, and another fabrication tool 1016 is configured to etch away a layer from a wafer. Furthermore, in some embodiments, the fabrication tools 1016 of the same type are designed to perform the same type of process.

EDA system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as design specification 1022.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
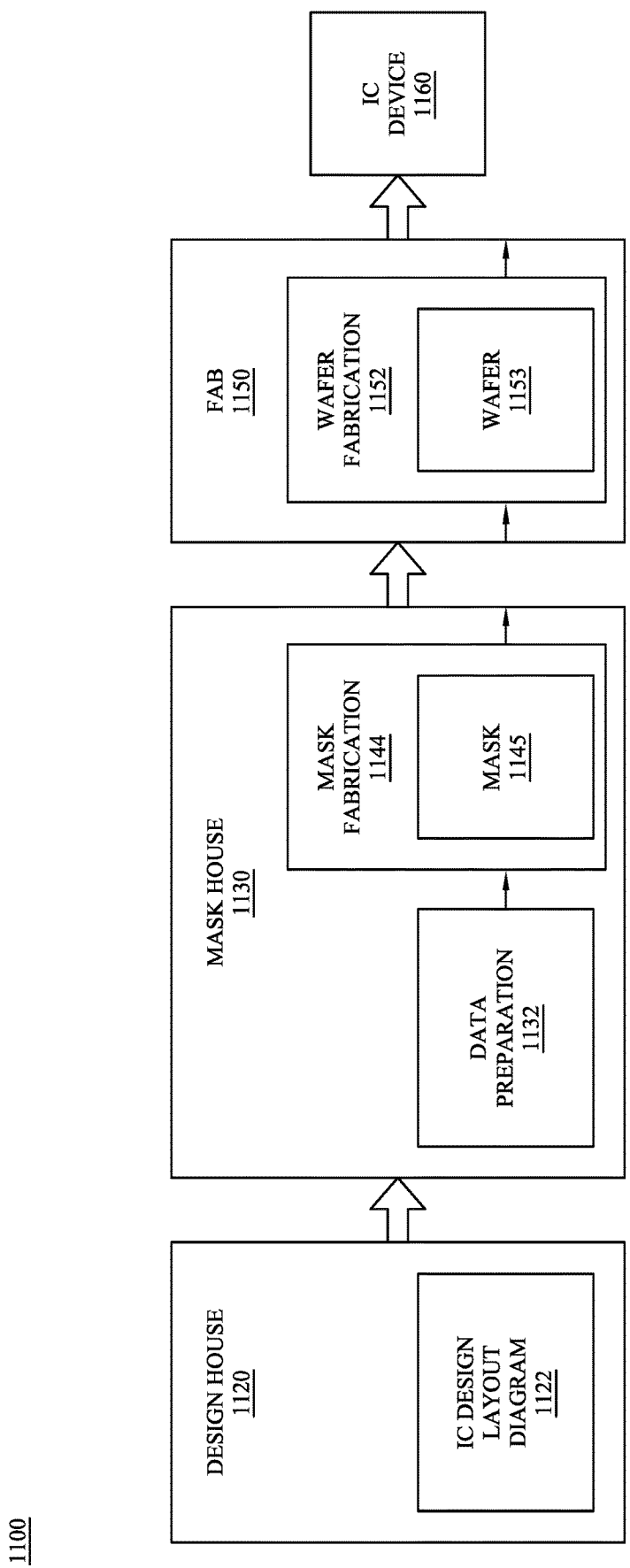
FIG. 11 is a block diagram of an integrated circuit manufacturing system, and an integrated circuit manufacturing flow associated therewith, in accordance with some embodiments.

FIG. 11 is a block diagram of IC manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in IC manufacturing system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, for example, an IC layout design depicted in FIGS. 3A-7, designed for an IC device 1160, for example, the devices 10, 30, 60-70 and 90 discussed above with respect to FIGS. 3A-7. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC fab 1150. In FIG. 11, data preparation 1132 and mask fabrication 1144 are illustrated as separate elements. In some embodiments, data preparation 1132 and mask fabrication 1144 can be collectively referred to as mask data preparation.

In some embodiments, data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1145 includes a transparent substrate (for example, fused quartz) and an opaque material (for example, chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

As described above, the present disclosure provides a device including a latch circuit in a first semiconductor layer and a pass circuit in a second semiconductor layer vertically separated from the first semiconductor layer. With the configurations of the present disclosure, the occupied area shrinks by 50%-70% and better manufacturing yield is provided, compared with some approaches.

In some embodiments, a device is disclosed. The device includes a latch circuit, a first pass-gate transistor, and a second pass-gate transistor. The latch circuit stores a bit data and is arranged in a first layer. The first pass-gate transistor and the second pass-gate transistor are arranged in a second layer separated from the first layer. The first pass-gate transistor is coupled between a first bit line and a first terminal of the latch circuit, and the second pass-gate transistor is coupled between a second bit line and a second terminal of the latch circuit.

In some embodiments, a device is disclosed. The device includes a first memory cell. The first memory cell has a first logic level at a first node coupled between a first terminal of a first inverter and a first terminal of a first pass-gate transistor. The first memory cell includes a first active region and a first gate structure. The first active region extends in a first direction in a first layer and is included in a structure as the first terminal of the first pass-gate transistor. The first gate structure extends in a second direction different from the first direction in a second layer that is separated from the first layer in a third direction perpendicular to the first and second directions. The first gate structure is coupled to the first active region and configured to be as the first terminal of the first inverter.

In some embodiments, a method is disclosed, including following operations: forming a first active area and a second active area that are arranged in a first layer; forming a first gate structure crossing the first active area and a second gate structure crossing the second active area, in which the first active area and the first gate structure are included in a structure as a first pass-gate transistor, and the second active area and the second gate structure are included in a structure as a second pass-gate transistor; forming an insulating layer above the first layer; and forming third to sixth active areas in a second layer above the insulating layer. The third and fourth active areas are included in a structure as a first inverter, and the fifth and sixth active areas are included in a structure as a second inverter. The first and second inverters are coupled between the first and second pass-gate transistors. The first gate structure is arranged between the first active area and the third active area, and the second gate structure is arranged between the second active area and the fifth active area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a latch circuit configured to store a bit data and arranged in a first layer and comprising a first pull-up transistor and a first pull-down transistor that include a shared first gate structure extending continuously along a first direction in a layout view; and
   a first pass-gate transistor and a second pass-gate transistor that are arranged in a second layer separated from the first layer,
   wherein the first pass-gate transistor is coupled between a first bit line and a first terminal of the latch circuit, and the second pass-gate transistor is coupled between a second bit line and a second terminal of the latch circuit.

2. The device of claim 1, further comprising:
   a first conductive line and a second conductive line arranged in a third layer, wherein the first layer is between the second and third layers; and
   a first contact via and a second contact via that extend from the third layer to the second layer to couple the first conductive line,
   wherein the first contact via is configured to couple the first conductive line to a gate terminal of the first pass-gate transistor to transmit a word line signal, and
   the second contact via is configured to couple the second conductive line to a gate terminal of the second pass-gate transistor to transmit the word line signal.

3. The device of claim 1, further comprising:
   a conductive line arranged in a third layer, wherein the second layer is between the first and third layers,
   wherein the first pass-gate transistor is configured to be turned on to transmit the bit data in response to a word line signal transmitted in the conductive line.

4. The device of claim 1,
   wherein the first pass-gate transistor comprises a second gate structure in the second layer as a gate terminal thereof,
   wherein the first gate structure and the second gate structure overlap with each other in the layout view.

5. The device of claim 4, wherein the first pull-up transistor comprises a first active region included in a structure as a terminal of the first pull-up transistor, and the first pass-gate transistor comprises a second active region included in a structure as a terminal of the first pass-gate transistor, wherein the first active region and the second active region overlap with each other in the layout view.

6. The device of claim 1, further comprising:

a contact via extending from the second layer to the first layer and configured to couple a source terminal of the first pass-gate transistor with the first terminal of the latch circuit.

7. The device of claim 1, wherein gate terminals of the first pull-up transistor and the first pull-down transistor are coupled to the first terminal of the latch circuit, wherein the first pass-gate transistor overlaps the first pull-up transistor or the first pull-down transistor in the layout view; and a second pull-up transistor and a second pull-down transistor, wherein gate terminals of the second pull-up transistor and the second pull-down transistor are coupled to the second terminal of the latch circuit, wherein the second pass-gate transistor overlaps the second pull-up transistor or the second pull-down transistor in the layout view.

8. The device of claim 1, further comprising:

an active area that extends in a second direction different from the first direction in the first layer and is included in a first structure as the first terminal of the latch circuit;

a second gate structure that extends in the first direction in the first layer, crosses the active area, and is included in a second structure as the second terminal of the latch circuit; and a third gate structure that extend in the first direction in the second layer and configured as a gate terminal of the second pass-gate transistor, wherein the second gate structure and the third gate structure are separated from each other in a third direction different from the first and second directions.

9. A device, comprising:

a first memory cell configured to have a first logic level at a first node coupled between a first terminal of a first inverter and a first terminal of a first pass-gate transistor, wherein the first memory cell comprises:

a first active region that extends in a first direction in a first layer and is configured to be included in a structure as the first terminal of the first pass-gate transistor; and a first gate structure shared by two transistors in the first inverter and in a layout view extending in a second direction different from the first direction in a second layer that is separated from the first layer in a third direction perpendicular to the first and second directions, wherein the first gate structure is coupled to the first active region and configured to be as the first terminal of the first inverter.

10. The device of claim 9, wherein the first memory cell further comprises:

an active area that includes the first active region and crosses the first gate structure in the layout view.

11. The device of claim 9, wherein the first memory cell is configured to have a second logic level, different from the first logic level, at a second node coupled between a second terminal of the first inverter and a first terminal of a second pass-gate transistor, wherein the first memory cell further comprises:

a second active region and a third active region that extend in the first direction in the second layer and are included in a structure as the second terminal of the first inverter, wherein the first active region and the second active region overlap with each other in the layout view.

12. The device of claim 11, wherein the first memory cell further comprises:

a second gate structure that extends in the second direction in the first layer and is configured to be as a gate terminal of the first pass-gate transistor;

wherein the device further comprises:

a contact via extending in the third direction from the first layer to a third layer above the second layer, and configured to transmit a word line signal to the second gate structure.

13. The device of claim 9, wherein the first memory cell further comprises:

a second gate structure that extends in the second direction in the first layer and is configured to be as a gate terminal of the first pass-gate transistor, wherein the first gate structure and the second gate structure overlap with each other in the layout view.

14. The device of claim 9, wherein the first memory cell is further configured to have a second logic level at a terminal, of a second inverter, coupled to a second terminal of the first inverter, wherein the first memory cell further comprises:

a conductive segment that extends in the second direction in the second layer and is included in a structure as the second terminal of the first inverter, and wherein the conductive segment and the first active region overlap with each other in the layout view.

15. The device of claim 9, wherein the first memory cell further comprises:

a second gate structure that extends in the second direction in the first layer and is configured to be as a gate terminal of the first pass-gate transistor;

wherein the device further comprises:

a second memory cell which is a mirror image of the first memory cell with respect to an imaginary line extending in the first direction, wherein the second memory cell comprises:

a gate structure that extends in the second direction in the first layer and is configured to be as a gate terminal of a pass-gate transistor in the second memory cell; and a contact via extending in the third direction from the first layer to a third layer above the second layer, and configured to transmit a word line signal to the second gate structure in the first memory cell and the gate structure in the second memory cell.

16. A device, comprising:

a first pass-gate transistor in a first layer comprising:

a first active area arranged in a substrate; and a first gate structure crossing the first active area;

a second pass-gate transistor comprising:

a second active area arranged in the first layer; and a second gate structure crossing the second active area;

a first inverter comprising a third active area and a fourth active area that are arranged in a second layer, wherein an insulating layer is sandwiched between the first layer and the second layer;

a second inverter comprising a fifth active area and a sixth active area that are arranged in the second layer;

wherein the first inverter and the second inverter are coupled between the first pass-gate transistor and the second pass-gate transistor, wherein the first gate structure is arranged between the first active area and the third active area, and the second gate structure is arranged between the second active area and the fifth active area.

17. The device of claim 16, wherein the first active area and the second active area are of a first conductivity type, wherein the third active area and the fifth active area are of a second conductivity type different from the first conductivity type, and the fourth active area and the sixth active area are of the first conductivity type.

18. The device of claim 16, further comprising:

a third gate structure arranged in the second layer and crossing the third active area and the fourth active area; and a fourth gate structure arranged in the second layer and crossing the fifth active area and the sixth active area, wherein in a layout view, the first gate structure overlaps the third gate structure, and the second gate structure overlaps the fourth gate structure.

19. The device of claim 16, further comprising:

a first conductive line and a second conductive line that extend in a first direction in a third layer between the first layer and the second layer, wherein the first conductive line and the second conductive line are coupled to the first pass-gate transistor and the second pass-gate transistor respectively.

20. The device of claim 19, further comprising:

a third conductive line and a fourth conductive line that extend in a second direction, different from the first direction, in a fourth layer above the second layer, wherein the third conductive line and the fourth conductive line are coupled to gate terminals of the first pass-gate transistor and the second pass-gate transistor.

* * * * *